United States Patent
Stopka et al.

(10) Patent No.: US 12,380,596 B2
(45) Date of Patent: Aug. 5, 2025

(54) METHOD AND SYSTEM FOR DETERMINING BEAM POSITION

(71) Applicant: FEI Company, Hillsboro, OR (US)

(72) Inventors: Jan Stopka, Brno (CZ); Bohuslav Sed'a, Brno (CZ); Radovan Vašina, Brno (CZ); Radim Šejnoha, Brno (CZ)

(73) Assignee: FEI Company, Hillsboro, OR (US)

( * ) Notice: Subject to any disclaimer, the term of this patent is extended or adjusted under 35 U.S.C. 154(b) by 405 days.

(21) Appl. No.: 17/561,554

(22) Filed: Dec. 23, 2021

(65) Prior Publication Data

US 2023/0206489 A1 Jun. 29, 2023

(51) Int. Cl.
G06T 7/73 (2017.01)
G06T 7/33 (2017.01)
G06T 7/37 (2017.01)

(52) U.S. Cl.
CPC ............... *G06T 7/74* (2017.01); *G06T 7/337* (2017.01); *G06T 7/37* (2017.01); *G06T 2207/10061* (2013.01)

(58) Field of Classification Search
CPC .. G06T 7/74; G06T 7/337; G06T 7/37; G06T 2207/10061; H01J 37/1471; H01J 2237/22; H01J 37/28; H01J 37/222; H01J 37/244; H01J 37/265; H01J 37/045; H01J 37/147
See application file for complete search history.

(56) References Cited

U.S. PATENT DOCUMENTS

| | | | |
|---|---|---|---|
| 9,536,702 B2* | 1/2017 | Lang | H01J 37/222 |
| 11,735,393 B2* | 8/2023 | Zeidler | H01J 37/244 |
| | | | 250/307 |
| 2012/0293810 A1 | 11/2012 | Meijer | |
| 2015/0069235 A1* | 3/2015 | Kemen | H01J 37/1472 |
| | | | 250/311 |
| 2015/0083911 A1* | 3/2015 | Zeidler | H01J 37/28 |
| | | | 250/362 |
| 2015/0348749 A1* | 12/2015 | Lang | H01J 37/261 |
| | | | 250/307 |
| 2017/0084423 A1* | 3/2017 | Masnaghetti | H01J 37/28 |
| 2018/0040454 A1 | 2/2018 | Mueller et al. | |
| 2018/0254167 A1* | 9/2018 | Zhao | H01J 37/20 |
| 2020/0233299 A1 | 7/2020 | Budach et al. | |
| 2020/0373115 A1* | 11/2020 | Mohammadi-Gheidari | H01J 37/153 |

(Continued)

FOREIGN PATENT DOCUMENTS

WO  WO-2021156198 A1  8/2021

OTHER PUBLICATIONS

EP22214931.2, Extended European Search Report, May 9, 2023, 8 pages.

*Primary Examiner* — Andrae S Allison

(57) ABSTRACT

Methods and systems to determine positions of multiple beamlets includes performing a first scan by scanning the beamlets over a first sample region and acquiring multiple cell images; and performing a second scan by scanning the beamlets over a second sample region and acquiring multiple cell images. Each cell image corresponds to a beamlet, and at least a part of an overlapped region between the first sample region and the second sample region is scanned by multiple beamlets during both the first scan and the second scan. Position of each beamlet may then be determined based on the corresponding cell images acquired during the first scan and the second scan.

18 Claims, 7 Drawing Sheets

(56) References Cited

U.S. PATENT DOCUMENTS

| | | |
|---|---|---|
| 2021/0296089 A1 | 9/2021 | Zeidler et al. |
| 2021/0351001 A1 | 11/2021 | Zeidler et al. |
| 2022/0146311 A1* | 5/2022 | Garini .................... G01J 3/462 |
| 2023/0317405 A1* | 10/2023 | Stopka ................. H01J 37/222 |
| | | 250/307 |

* cited by examiner

METHOD AND SYSTEM FOR DETERMINING BEAM POSITION

FIELD OF THE INVENTION

The present description relates generally to methods and systems for determining beam position, and more particularly, to determining the positions of beamlets in a multi-beam scanning electron microscope.

BACKGROUND OF THE INVENTION

Multi-beam scanning electron microscope (MBSEM) increases imaging throughput by simultaneously scanning a sample using multiple beamlets. The image in a MBSEM may comprise multiple cell images, wherein each cell image is formed from signals received responsive to irradiation of a single beamlet. The multiple cell images may be stitched together based on beamlets' positions to form the MBSEM image. However, displacements from expected beamlets' positions may introduce errors in the stitched MBSEM image. Therefore, a fast, robust, and reliable method for determining beamlets' positions is needed.

SUMMARY

In one embodiment, a method for determining beamlets' positions in a multi-beam system comprises: performing a first scan by scanning multiple beamlets over a first sample region; acquiring multiple cell images of the first sample region, wherein each cell image is formed based on signals received responsive to irradiation from a corresponding beamlet of the multiple beamlets; performing a second scan by scanning the multiple beamlets over a second sample region; acquiring multiple cell images of the second sample region, wherein at least a part of an overlapped region between the first sample region and the second sample region is scanned by at least a beamlet of the multiple beamlets during both the first scan and the second scan; and determining a relative position between at least two beamlets of the multiple beamlets based on the corresponding cell images acquired during the first scan and the second scan. In this way, the beamlets' positions may be accurately determined. Further, the determined beamlets' positions may be applied to signals subsequently collected from the MBSEM system.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

Like reference numerals refer to corresponding parts throughout the several views of the drawings.

DETAILED DESCRIPTION

The following description relates to systems and methods for determining displacements of beamlets in a multi-beam scanning electron microscope (MBSEM). The MBSEM provides high throughput sample images by simultaneously scanning a sample with multiple beamlets. The MBSEM may acquire sample images in either the transmission or reflection mode. The MBSEM may also acquire sample image from secondary electron signals. The beamlets may simultaneously irradiate a sample with similar incident angle. That is, the beamlets are substantially parallel to each other at a sample plane. Each beamlet corresponds to a different beamlet position at the sample plane. The beamlets scan a sample region by actuating one or more deflectors. Each beamlet scans a different portion of the sample region and a cell image corresponding to the beamlet is acquired. The scan range of each beamlet may be determined based on the beamlets' positions at the sample plane. For example, the scan range is not less than the distance between adjacent beamlets at the sample plane, so that the entire sample region is scanned by the beamlets. The cell images may be combined, for example by stitching together, to form a field image of the sample region. In order to cover a large region of interest (ROI), after acquiring data for a field image, the sample may be translated relative to the beamlets, and another sample region is imaged. The field images may be combined to cover the large ROI.

Figure 2:
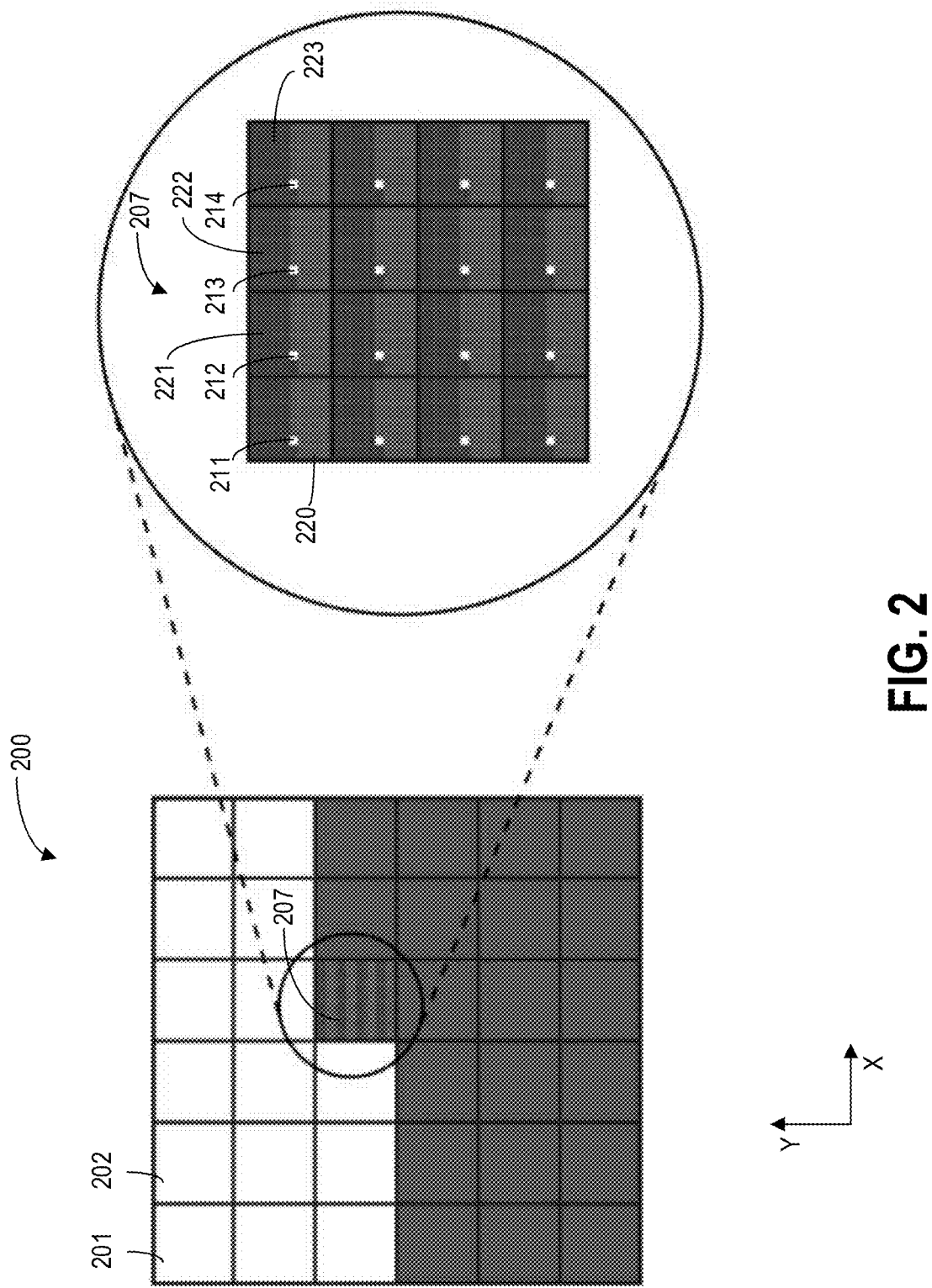
FIG. 2 illustrates a procedure for generating sample images using the MBSEM.

FIG. 2 illustrates a sample 200 imaged by a MBSEM. Each grid in sample 200 corresponds to a sample region imaged in a field image. The field images are acquired sequentially by translating the sample relative to the multiple beamlets. For example, after scanning sample region 201 for a first field image, the sample is translated by actuating the sample stage, and sample region 202 is scanned for a second field image. In this example, each field image includes 4×4 cell images. Each cell image is acquired by scanning the 4×4 beamlets according to a scanning pattern (such as zig-zag). In the zoomed-in sample region 207, the beam locations (such as beam locations 211-214) during a scan for generating cell images are shown. Each cell image in a field image corresponds to a beamlet. For example, the cell image acquired from sample portion 220 corresponds to a first beamlet, and the cell image acquired from sample portion 221 corresponds to a second beamlet, adjacent to the first beamlet. Sample image covering the sample 200 may be generated by stitching the field images based on the amount of sample translation. Each field image may be generated by stitching the cell images based on the beamlets' positions relative to each other.

The cell images may be combined, such as by stitching together, to form a field image. The cell images may be stitched based on the beamlets' positions at the sample plane. The beamlets' positions may be recorded as relative positions from each other. For example, one of the beamlet is selected as a reference beamlet, and another beamlet's position is recorded as its position relative to the reference beamlet. The relative position between two beamlets may be recorded in the form of a vector. The vector captures both a distance and a relative direction of one beamlet to another beamlet. The beamlets may displace from their expected positions due to system design and random misalignments. The displacements may be different for different systems and may cause stitching error in the field image.

One method for removing the stitching error in field image is to increase the field of view (FOV) of the cell image by increasing the scan range of the beamlets, so that adjacent cell images are overlapped. The cell images may then be stitched together by registering the features in the overlapped area. However, Applicant recognizes that increasing the FOV of cell images can increase the data acquisition time and the volume of acquired data. Further, in order to successfully register cell images from a sample with sparse features, the overlapped region in adjacent cell images has to be increased, which may further increase the data volume and decrease the system throughput.

In order to address the above issues, certain portions of the sample can be scanned twice to acquire two overlapped cell images corresponding to a beamlet, and positions of the beamlets may be determined based on the overlapped cell images. For example, a first sample region is scanned using multiple beamlets during a first scan, and multiple cell images are acquired. A second sample region is scanned using the multiple beamlets during a second scan, and multiple cell images are acquired. The first sample region and the second sample region are overlapped with each other. At least a part of the overlapped region is scanned by the same beamlet of the multiple beamlets. In other words, a first cell image acquired during the first scan overlaps with a second cell image acquired during the second scan, wherein the first and second cell images are acquired responsive to the scan of the same beamlet. The displacement of the beamlet relative to an expected beamlet position can be determined based on the first cell image and the second cell image. The actual relative position between at least two beams may be determined based on the expected beamlet position and the beamlet displacement. Because the beamlets displacements are stable in time, the actual beam position may be saved and applied to further field image acquisitions.

In one example, the positions of all beamlets are determined based on the cell images acquired during the first and second scan. In another example, positions of a subset of the multiple beamlets are determined based on the corresponding cell images acquired during the first and second scan. The positions of the rest of the multiple beamlets may be calculated from the aberration polynomial having fitted the appropriate coefficients based on the subset beamlets' positions. For example, a relative position between at least two beamlets of the multiple beamlets are determined based on the cell images. The positions of each and every beamlets are calculated based on the relative position between the at least two beamlets.

In one example, the beamlets' displacements may be determined and compensated during a sample imaging session wherein multiple field images are acquired. After acquiring a field image of a first sample region, the beam axis of the beamlets may be adjusted to acquire a field image of a second sample image region overlapped with the first sample region. The second sample region is selected so that the second sample region has already been imaged during the imaging session. In this way, the beamlets' positions may be updated based on the first and second field images without introducing radiation sample damage to the sample area that has not been imaged. Additionally, the beamlets' positions may be checked regularly for adjusting the optical components of the MBSEM, in order to correct aberrations.

In another example, the beamlets' positions may be determined using a reference sample. The determined beamlets' positions may then be stored and used for future sample scan/image.

Figure 1:
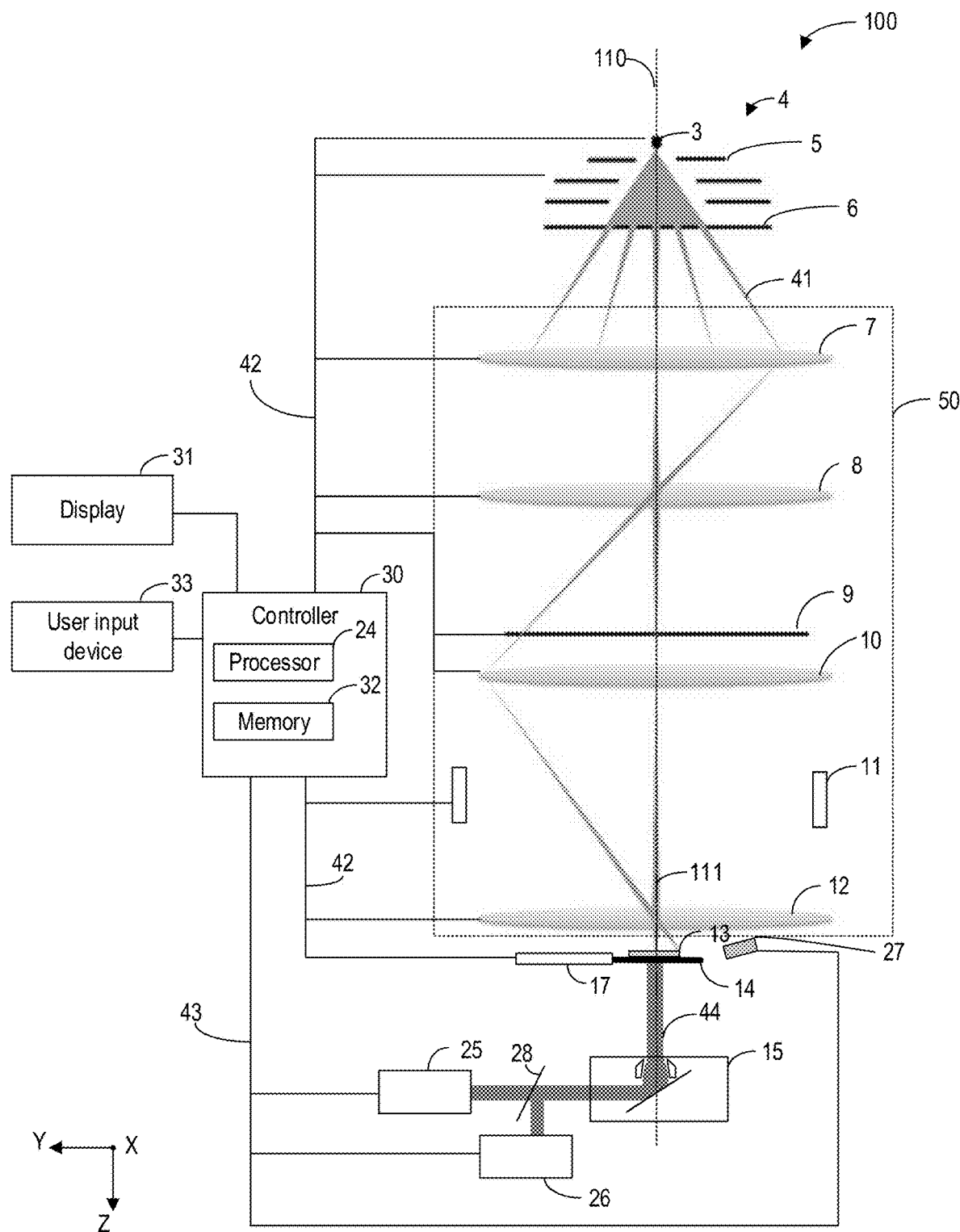
FIG. 1 shows an example multi-beam scanning electron microscope (MBSEM).

Turning to FIG. 1, an example MBSEM 100 is shown. The microscope includes a vacuum enclosure (not shown) and a charged particle source 4 for producing multiple charged particle beamlets along a primary axis 110. The charged particle source 4 may include an electron source 3, extractor 5 and aperture lens array (ALA) 6. The multiple beamlets are directed to sample 13 along a beam axis 111 after passing an electron-optical illuminator 50. The beam axis may overlap with the primary beam axis 110, as shown in the figure. The electron-optical illuminator 50 may include multiple lenses (such as lenses 7, 8, 10 and 12), aperture 9, and deflectors 11. The multiple beamlets may be scanned relative to beam axis 111 by sending signals to the deflectors 11. Further, the beam axis 111 may be adjusted by shifting and/or tilting relative to primary axis 110 by operating the deflectors 11. The beamlets may then be scanned relative to the adjusted beam axis.

Sample 13 is held in a sample plane with a sample holder 14 that can be positioned in multiple degrees of freedom by a sample stage 17. In one example, the sample holder 14 is a scintillator under sample 13. If sample 13 is a thin specimen, MBSEM 100 may be operated in a transmission mode, wherein charged particles transmitted through the sample may reach the scintillator and be converted to light 44. The light may be detected by camera 25 after passing the detector light optics 15. Camera 25 may include a Silicon photomultipliers (SiPMs). Sample images can be formed from signals detected by camera 25. In some embodiments, a portion of light 44 may be deflected by beam splitter 28 and detected by diagnostic camera 26 at a detection plane. In another example, MBSEM 100 operates in a reflection mode, wherein charged particles emitted from sample 13 are collected by camera 27 at a detection plane.

In some embodiments, sample holder 14 does not include a scintillator, and charged particles transmitted through sample 13 are detected by a pixelated detector for charged particles positioned downstream of the sample holder 14.

The controller 30 comprises a processor 24 and non-transitory memory 32. Computer readable instructions may be stored in the non-transitory memory 32, when being executed, causes the controller 30 to perform the methods disclosed herein. The controller may provide a variety of functions, such as synchronizing actions, providing setpoints, processing signals, performing calculations, receiving operator input from user input device 33 and displaying messages/information on display device 31. The controller 30 communicates with various illustrated components via control lines 42. For example, controller 30 may be configured to adjust beam parameters including beam current by communicating to the charged particle source 4. The controller 30 may be configured to adjust scanning parameters including one or more of the scanning pattern, dwell time, and scanning range of each beamlet by adjusting the deflectors 11. The controller 30 may be configured to position the sample and translate the sample relative to the primary axis 110 by actuating the sample stage 17. The controller may adjust beamlets' positions on sample 13 by actuating one or more optical components of the electron-optical illuminator. Further, controller 30 receives signals detected by one or more cameras 25, 26 and 27 via data bus 43, processes the signals and generates images based on the processed signal, for example, on display 31.

Figure 3:
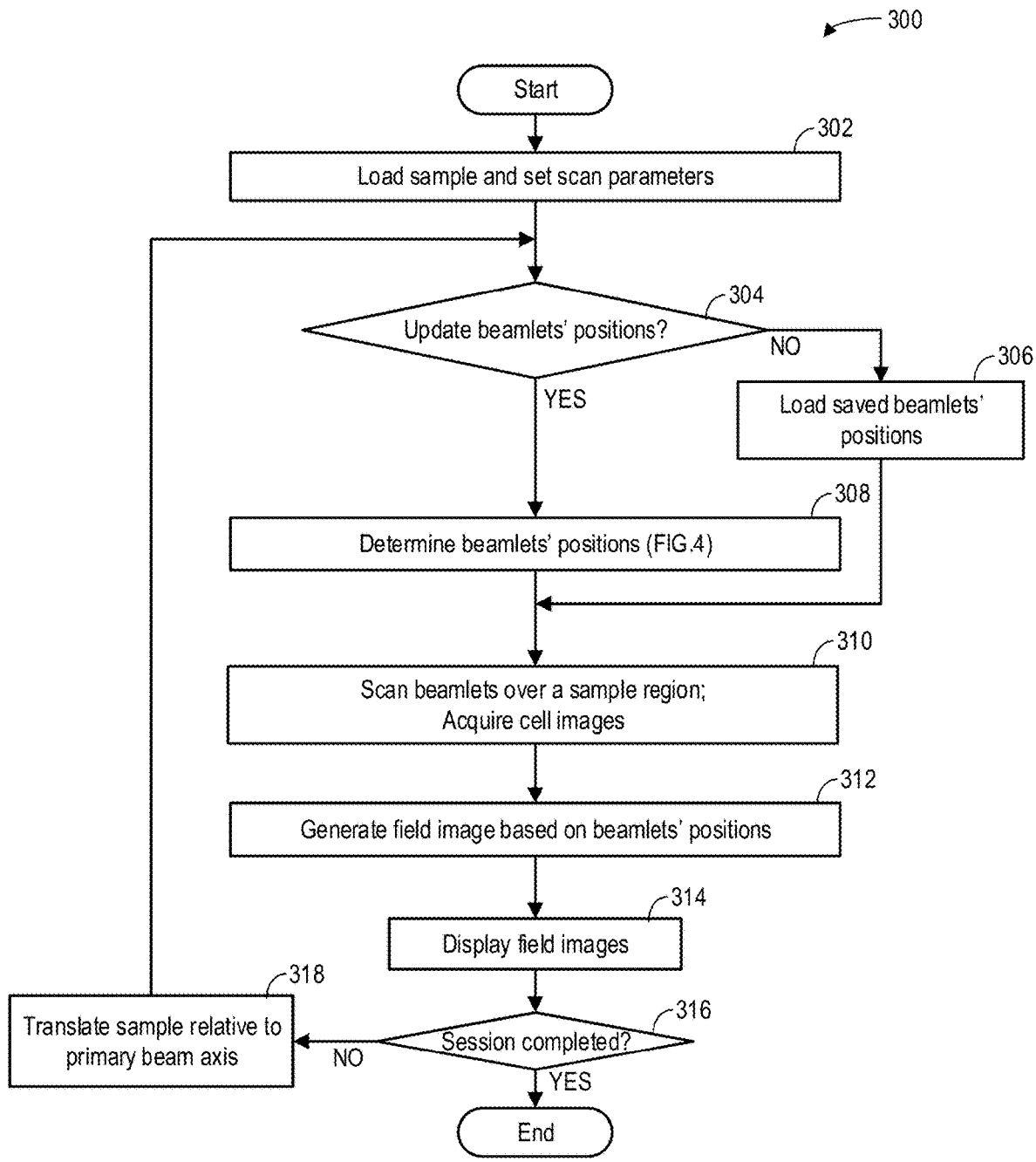
FIG. 3 shows an example method for imaging a sample using the MBSEM.

FIG. 3 shows an example method 300 for imaging a sample using a MBSEM system, such as the MBSEM system 100 of FIG. 1. Multiple cell images are acquired by scanning the beamlets while the sample is stationary relative to the primary axis. The sample is then translated/moved to another sample position, so that an adjacent sample region is scanned by the beamlets. Cell images acquired at each sample position are combined to form a field image, and multiple field images are combined to form a sample image to cover a large ROI.

At 302, the sample is loaded into the vacuum chamber of the MBSEM. Scan parameters for the imaging session are set. The scan parameters may include one or more of the charged particle beam parameters, scan patterns, the scan range of each beamlet, and the dwell time. The scan range of each beamlet may be determined based on the expected beamlets' positions at the sample plane. The scan patterns may include the number of field images needed to cover the entire field of view, as well as the sample translation steps to cover the field of view.

At 304, method 300 checks whether the beamlets' positions need to be updated. In one example, the beamlets' positions may be updated at the beginning of the scan session. In another example, the beamlets' positions may be updated if beamlets' positions have not been calibrated for a predetermined time period. In yet another example, the beamlets' positions may be updated periodically. If the beamlets' positions do no need to be updated, method 300 may load saved beamlets' positions at 306. Otherwise, method 300 determines beamlets' positions at 308. The beamlets' positions may be determined based on displacements from the expected beamlets' positions. The positions of the beamlets may be recorded according to coordinates of the acquired image, for example, as pixel numbers in the cell image or field image. The positions of the beamlets may alternatively be recorded according to coordinates in the sample plane. The beamlets' positions may include the position of each and every beamlet of the MBSEM. Beamlets' positions may be positions of each and every beamlet in the sample plane or in the detection plane associated with the camera.

Figure 4:
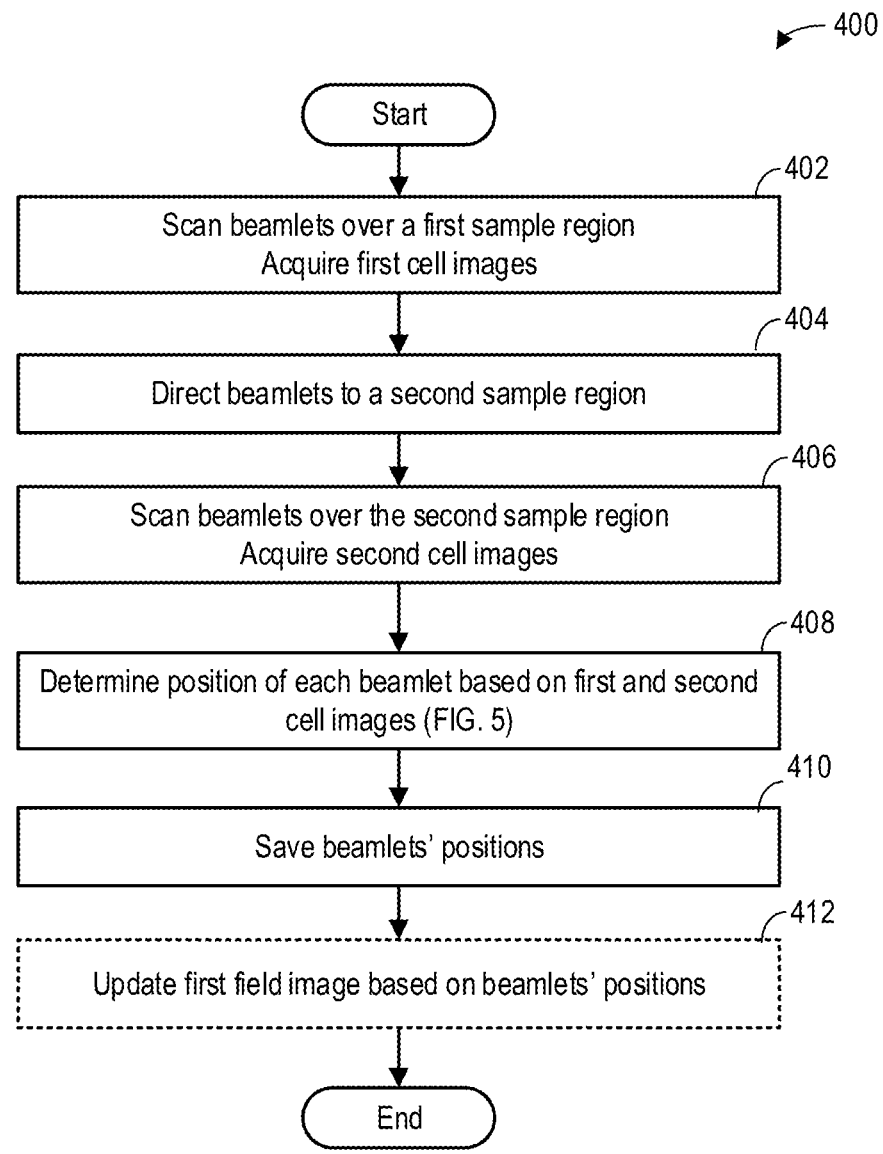
FIG. 4 shows a method of determining beamlets' positions.

At 308, the beamlets' positions may be determined by scanning two overlapped sample regions with the multiple beamlets, wherein a part of the overlapped sample region is scanned by at least one of the beamlets. In one example, the cell images corresponding to the same beamlet are overlapped. The displacement of the beamlet may be determined by the pixel shift of features in the overlapped area of the corresponding cell images. FIG. 4 shows details for determining the beamlets' positions.

At 310, the multiple beamlets are scanned over a sample region, and cell images corresponding to a field image are acquired. As an example, as shown in FIG. 2, 4×4 cell images of field region 201 are acquired.

At 312, a field image is formed based on cell images acquired at 310. The field image may be formed by stitching the cell images based on the beam positions.

At 314, the field images of the sample are displayed. The displaced field images may be stitched together based on the amount of sample translation at 318. In this way, as more sample surface is scanned during the imaging session, the displayed field images are updated with newly formed field image, so that the operator is informed with the progress of the session. Alternately, the field images may be stitched together and displaced as a sample image when the scan is completed.

At 316, method 300 checks whether the entire imaging session is completed. If the session is completed, method 300 exits. Otherwise, the sample is translated in the sample plane relative to the primary axis at 318, for example, by actuating the sample stage. The amount of sample translation relates to the field of view of the field image. The amount of sample translation may be selected so that the adjacent field images are overlapped. After the sample is translated, another field image may be acquired by scanning the multiple beamlets over another sample region.

In this way, beamlets' positions may be calibrated before or during the sample scan. No additional reference sample is needed for the beam position calibration process.

FIG. 4 shows method 400 for determining beamlets' positions. Method 400 may be performed while scanning a sample, as shown in FIG. 3. Alternatively, method 400 may be performed on a reference sample for determining beamlet displacements.

At 402, the beamlets scan over a first sample region and the first multiple cell images are acquired. The beamlets may be scanned by actuating the deflectors of the electron-optical illuminator according to a scan pattern. The first multiple cell images may be stitched together to form the first field image.

At 404, the beamlets are directed to a second sample region. In one example, the beamlets are directed to the second sample region by translating the sample in the sample plane. In another example, the beamlets are directed to the second sample region by adjusting the deflectors. Comparing to translating the sample, adjusting the deflectors is faster and may be more accurate. The shift of the second sample region from the first sample region at the sample plane is smaller than the scan range of each beamlet. In one example, the amount of shift between the first sample region and the second sample region is not greater than half of the beamlet scan range in either the X direction or the Y direction at the sample plane. In another example, the amount of shift is not greater than one third of the beamlet scan range in either the X direction or the Y direction at the sample plane.

Figure 6:
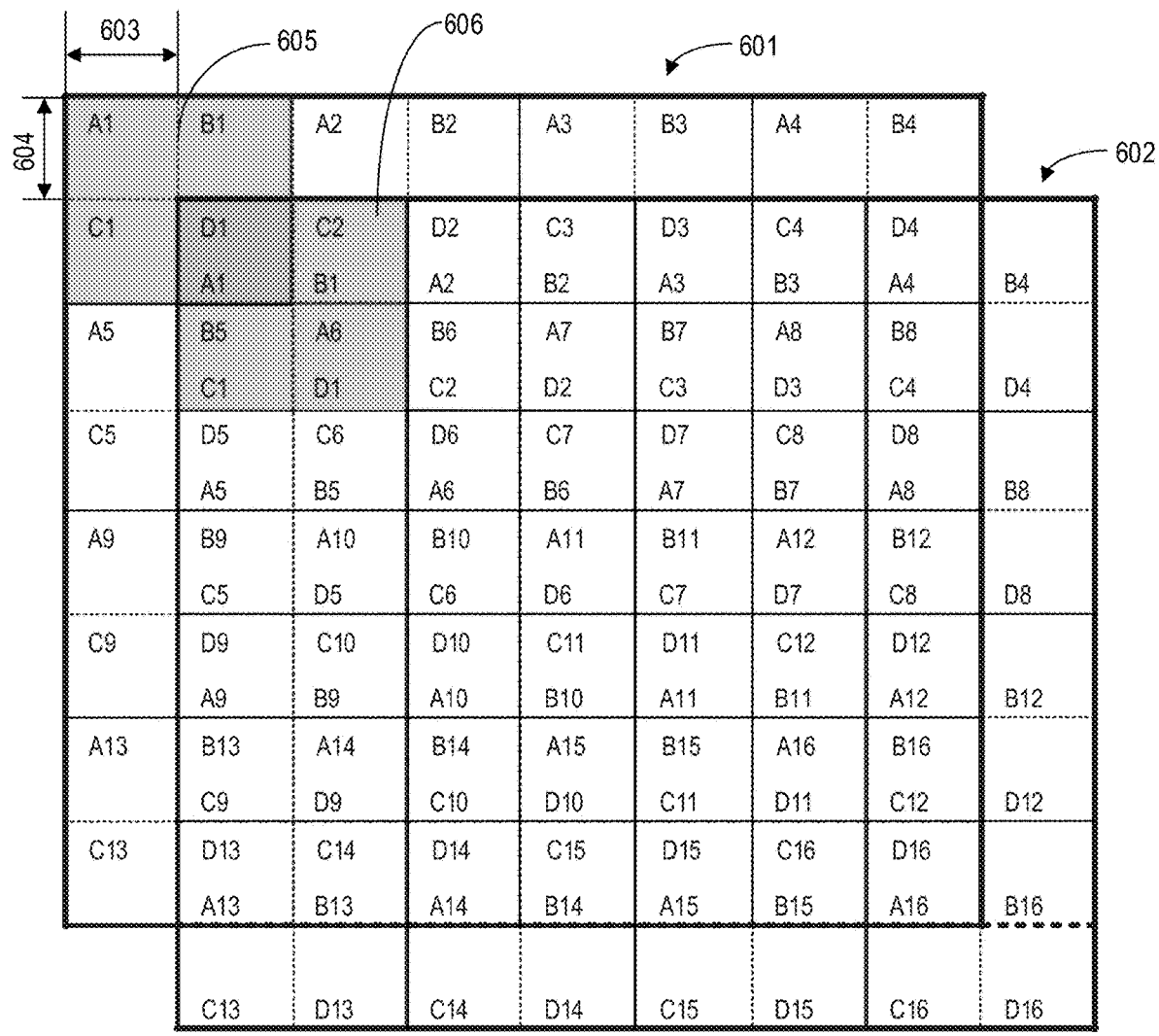
FIG. 6 illustrates sample regions covered by overlapped cell images.
Figure 6:
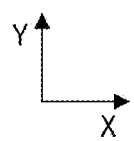

At 406, the beamlets scan over a second sample region and the second multiple cell images are acquired. The second multiple cell images may be combined to form a second field image. FIG. 6 illustrates a first field image 601 and a second field image 602. Each field images includes 4×4 cell images. The second field image is shifted from the first field image distance 603 in the X-direction and distance 604 in the Y-direction. For example, the second field image is shifted from the first field image for half of the size of the cell image in both the X and Y directions. The first beamlet is used to acquire the first cell image 605 in field image 601, as well as the first cell image 606 in field image 602. Each of the first cell image (605, 606) includes four sections A1, B1, C1, and D1, wherein section D1 in the first cell image 605 and section A1 in the first cell image 606 correspond to an overlapped sample region scanned by the same first beamlet. Similarly, section D2 in the first field image 601 and section A2 in the second field image 602 correspond to an overlapped sample region scanned by the same second beamlet. If there is no beamlet displacement (or the beamlet displacement is zero), section D1 in the first field image 601 should be the same as section A1 in the second field image 602. If beamlet displacement exits (or the beamlet displacement is nonzero), the amount of displacement of a particular beamlet can be determined based on the shift of shared features in the overlapped area of cell images corresponding to the beamlet.

Figure 5:
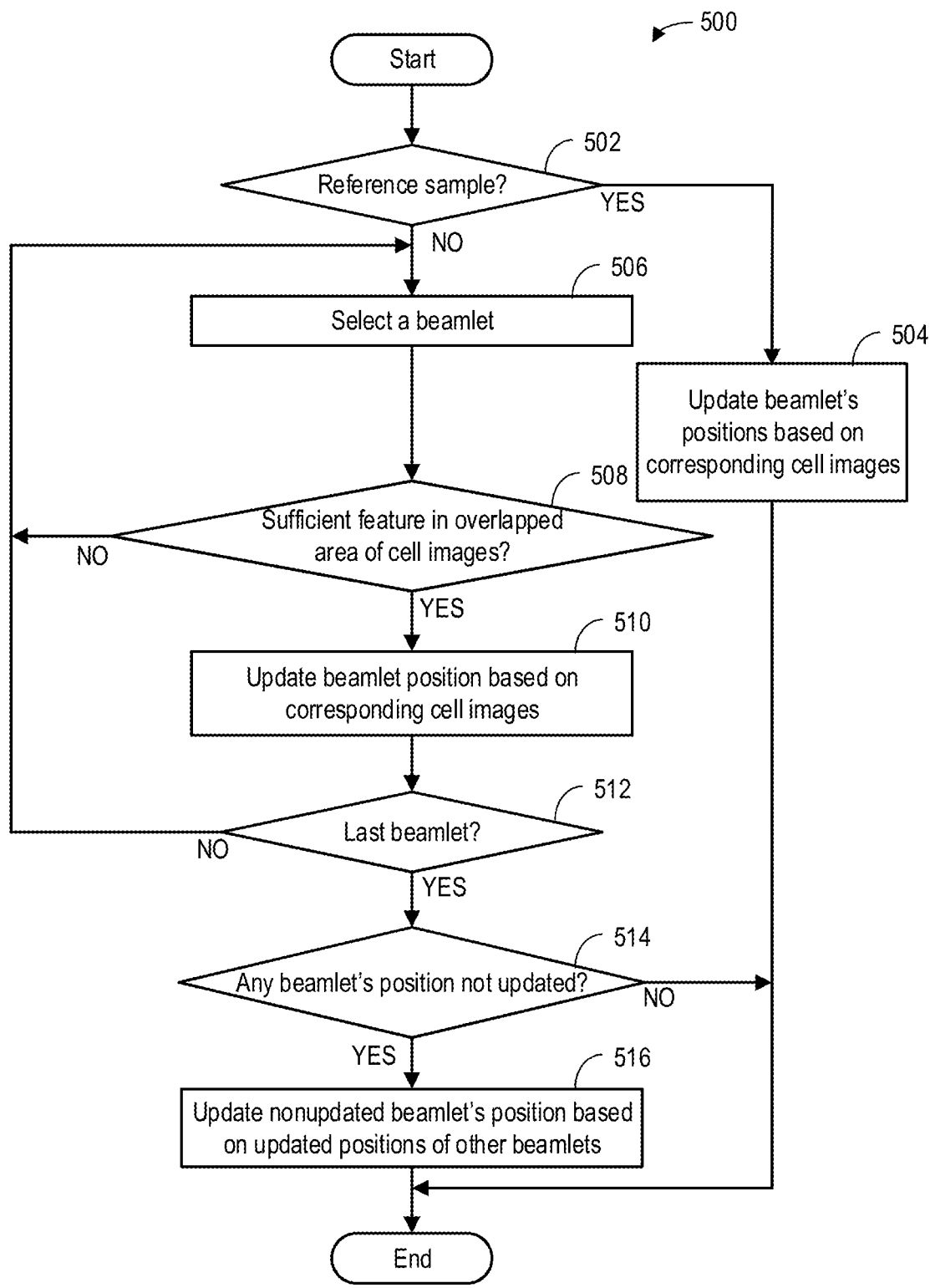
FIG. 5 shows a method of calculating beamlets' positions from overlapped cell images.

At 408, the position of each beamlet is determined from the first and second cell images. The beamlet position may be determined based on the shift of features in the overlapped area of corresponding cell images. If there is no sufficient feature in the overlapped area of the corresponding cell images, the displacement of the beamlet may be calculated based on the determined beamlets' positions of other beamlets. Details for determining position for each beamlet is shown in FIG. 5.

At 410, the beamlets' positions saved. The saved beamlets' positions may be used to stitching cell images to form the field image.

At 412, the first field image may optionally be updated by stitching the first multiple cell images using the beamlets' positions determined at 408. For example, the updated first field image may be displayed in at 314 of FIG. 3.

Figure 7:
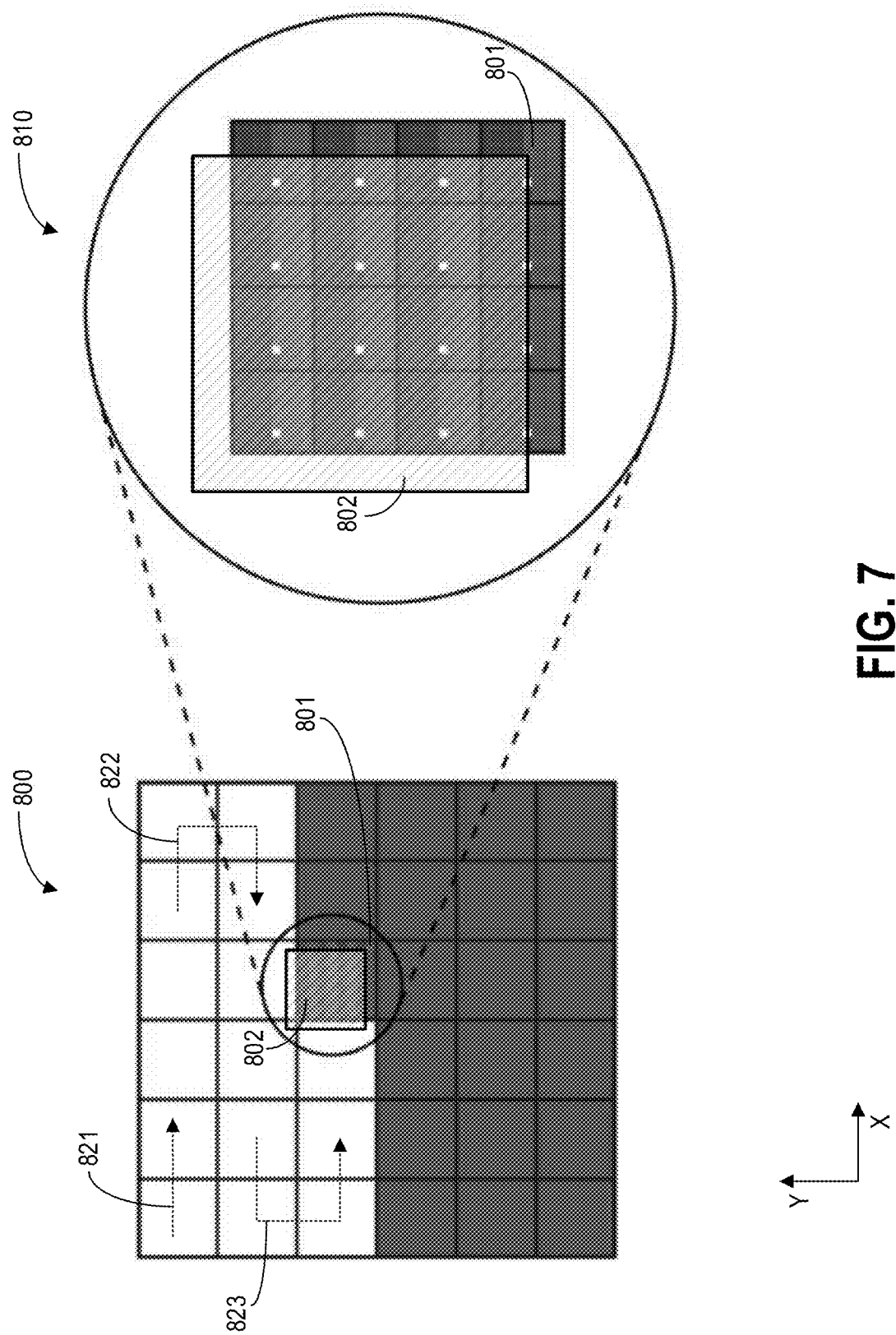
FIG. 7 illustrates determining beamlets' positions while scanning a large sample area.

In some embodiments, if method 400 is executed during a sample imaging session (such as in FIG. 3), the second sample region may be selected to be a region that has already been scanned by the beamlets. For example, FIG. 7 shows a sample 800 being imaged with the MBSEM. Each grid in sample 800 indicates a sample region imaged in a field image. The sample is translated along the X and Y axes so that sample regions are imaged in a sequence (along a zig-zag path) indicated by arrows 821, 822, and 823. The grids in white correspond to sample regions that have been imaged, and the grids in gray correspond to sample regions that have not been imaged. The beamlets may first direct to the first sample region 801 to acquire a first field image, and then direct to the second sample region 802 to acquire a second field image. The second sample region 802 overlaps with the first sample region 801. The second sample region is shifted from the first sample region for a distance less than the scan range of the cell image in either the X or Y direction in the sample plane. The second sample region covers a portion of the sample that has already been scanned with the multiple beamlets. The first field image will be displayed together with field images of the other sample regions, such as in step 314 of FIG. 3. The second field image may be used for determining the beamlets displacements or positions. In this way, beamlets' positions may be determined without introducing additional sample damage due to charged particle irradiation.

FIG. 5 shows method 500 for determining beamlets' positions based on cell images acquired at two overlapped sample regions. For example, the first multiple cell images are acquired from the first sample region, and the second multiple cell images are acquired from the second sample region.

At 502, method 500 checks whether the cell images are acquired from a reference sample. A reference sample may include regularly spaced features. If the cell images are acquired from the reference sample, method 500 proceeds to 504. Otherwise, if the cell images are acquired from a sample under investigation, method 500 proceeds to 506.

At 504, position of each beamlet is determined based on the corresponding cell images in respect to the known features of the reference sample. For example, the reference sample may be a flat sample with lithographically etched dots or crosses.

At 506, a beamlet of the multiple beamlets is selected.

At 508, method 500 checks whether there are sufficient shared features in the overlapped area of the cell images corresponding to the selected beamlet. For example, shared features in the overlapped area of the cell images may first be identified. The pixel numbers corresponding to the shared features are calculated. The shared features in the overlapped area are sufficient if the number of pixels is higher than a threshold number. If overlapped area of the cell images does not include sufficient shared features (i.e. the overlapped area is featureless in one or both of the cell images), the position of the selected beamlet cannot be updated. The beamlet position of the selected beamlet may be marked as not updated. Method 500 then moves to 506 to select another beamlet. Otherwise, if there are sufficient shared features in the overlapped area of the cell images, method 500 moves to 510 to determine position of the selected beamlet.

At 510, position of the selected beamlet is determined based on the corresponding cell images. The displacement of the beamlet may be determined from shift of one or more shared features in the overlapped area of the cell images corresponding to the beamlet. For example, in FIG. 6, displacement of the first beam is determined from pixel shift of features in the overlapped area (section D1 or A2) between first cell image 605 and second cell image 606. The shift of features may be determined by registering the features in the overlapped region of the two cell images. Feature registration may be achieved for example based on cross-correlation. The actual beamlet position is determined by applying the beamlet displacement to the expected beamlet position.

At 512, method 500 checks whether all beamlets have been selected. If not, another beamlet is selected at 506. Otherwise, at 514, method 500 checks if any beamlet position has not been updated. The position of a beamlet may not be updated when overlapped area in one or both of the two corresponding cell images is featureless. In other words, the shift between the cell images cannot be determined.

At 516, the position of any beamlet that has not been updated is determined based on updated beamlets' positions. Because all beamlets travels through the same optical components in the electron-optical illuminator before reaching the sample plane, distribution of the beamlets' positions may be characterized with a polynomial model. Therefore, the position of any beamlet that has not been updated may be determined by fitting a polynomial model to the updated beamlet positions. The specific form of the polynomial model is system dependent. For example, the polynomial model may include terms of three to five order. Some of the terms may be set to zero if the system includes rotationally symmetrical optical components. The beamlet position of the nonupdated beamlet can then be determined based on the fitted polynomial model and the arrangement of the beamlets.

In this way, the beamlets' positions can be updated either with a reference sample or during a sample imaging session. The beamlets' positions can be determined in any MBSEM system, such as MBSEM operated in either the transmission mode or the reflection mode, as well as MBSEM acquiring secondary electron signals. No sample radiation damage is introduced to sample during the determination. The beamlets' positions can be quickly, reliably and accurately updated.

The technical effect of scanning an overlapped sample region with the same beamlet is that the cell images corresponding to the beamlet are overlapped, and shift of features in the overlapped area can be calculated. The shift of the features is proportional to the beam displacement. The technical effect of updating the beamlets' positions is to correct stitching artifact in the field image. The technical effect of accurately estimating the beamlets' positions is that the scan range of the beamlet may be reduced and the system throughput may be increased.

In one embodiment, a method for determining beamlets' positions in a multi-beam system includes performing a first scan by scanning multiple beamlets over a first sample region; acquiring multiple cell images of the first sample region, wherein each cell image is formed based on signals received responsive to irradiation from a corresponding beamlet of the multiple beamlets; performing a second scan by scanning the multiple beamlets over a second sample region; acquiring multiple cell images of the second sample region, wherein at least a part of an overlapped region between the first sample region and the second sample region is scanned by at least two beamlets of the multiple beamlets during both the first scan and the second scan; and determining a relative position between the at least two beamlets of the multiple beamlets based on the corresponding cell images acquired during the first scan and the second scan. In a first example of the method, the method further includes wherein a first cell image corresponding to a particular beamlet of the multiple beamlets is acquired during the first scan, a second cell image corresponding to the beamlet is acquired during the second scan, and the first cell image overlaps with the second cell image. A second example of the method optionally includes the first example and further includes wherein determining the relative position between the at least two beamlets of the multiple beamlets based on the corresponding cell images acquired during the first scan and the second scan includes determining a displacement of the beamlet from an expected beamlet position based on a shift of at least a feature of the overlapped region in the corresponding cell images. A third example of the method optionally includes one or more of the first to the second examples, and further includes responsive to no identifiable feature in the overlapped region in either the first cell image or the second cell image, determining the relative position between the at least two beamlets based on positions of one or more other beamlets. A fourth example of the method optionally includes one or more of the first to the third examples, and further includes, wherein determining the relative position between the at least two beamlets based on positions of one or more other beamlets includes determining the relative position between the at least two beamlets by fitting a polynomial model to the positions of one or more other beamlet. A fifth example of the method optionally includes one or more of the first to the fourth examples and further includes wherein scanning multiple beamlets over the first sample region includes scanning each beamlet over a different portion of the first sample region, and wherein a scan range of each beamlet is not less than an expected distance between adjacent beamlets at a sample plane. A sixth example of the method optionally includes one or more of the first to the fifth examples and further includes translating the sample by actuating a sample stage; acquiring multiple cell images of a third sample region; and generating a sample image of the third sample region from the multiple cell images of the third sample region based on the determined relative positions between the at least two beamlets of the multiple beamlets. A seventh example of the method optionally includes one or more of the first to the sixth examples and further includes, wherein determining the relative position between the at least two beamlets of the multiple beamlets based on corresponding cell images acquired during the first scan and the second scan includes: determining a position of each and every beamlet of the multiple beamlets at a sample plane based on the cell images acquired during the first scan and the second scan. An eighth example of the method optionally includes one or more of the first to the seventh examples and further includes, wherein the first sample region and the second sample region belong to a reference sample, and the method further comprising: saving the position of each beamlet; scanning the multiple beamlets over a second sample; generating a sample image of the second sample based on the saved position of each beamlet. A ninth example of the method optionally includes one or more of the first to the eighth examples and further includes, wherein generating the sample image of the second sample based on the saved position of each beamlet includes: acquiring multiple cell images of the second sample, and generating the sample image of the second sample by stitching the acquired multiple cell images of the second sample based on the saved position of each beamlet. A tenth example of the method optionally includes one or more of the first to the ninth examples and further includes, translating the sample by actuating a sample stage between the first scan and the second scan. An eleventh example of the method optionally includes one or more of the first to the tenth examples and further includes, comprising directing the multiple beamlets to the second sample region by adjusting one or more deflectors between the first scan and the second scan.

In another embodiment, a method for imaging a sample using a multi-beam system includes scanning multiple beamlets over a first sample region and generating a first field image; scanning the multiple beamlets over a second sample region and generating a second field image, wherein each beamlet of the multiple beamlets scans at least a part of an overlapped region between the first sample region and the second sample region; updating beamlets' positions based on the first image and the second image; translating the sample by actuating a sample stage holding the sample; and scanning the multiple beamlets over a third sample region and generating a third field image based on the updated beamlets' positions. In a first example of the method, wherein generating the third field image based on the updated beamlets' positions includes: acquiring multiple cell images, wherein each cell image is formed by signals collected responsive to irradiation from a corresponding beamlet over the third sample region; and generating the third field image by stitching the multiple cell images based on the updated beamlets' positions. A second example of the method optionally includes the first example and further includes generating a sample image by stitching the first field image and the third field image based on an amount of the sample translation. A third example of the method optionally includes one or more of the first to the second examples, and further includes adjusting a beam axis of the multiple beamlets before scanning the multiple beamlets over the second sample region. A fourth example of the method optionally includes one or more of the first to the third examples, and further includes wherein the second sample region does not overlap with the third sample region.

In yet another embodiment, a multi-beam system includes a beam source for generating multiple beamlets; deflectors for scanning the multiple beamlets over a sample relative to a beam axis; a sample holder for translating the sample; and a controller including computer readable instructions stored in a non-transitory memory, wherein when the computer readable instructions are executed by a processor, the controller is configured to: perform a first scan by scanning multiple beamlets over a first sample region; acquire multiple cell images of the first sample region, wherein each cell image is formed based on signals received responsive to irradiation from a corresponding beamlet of the multiple beamlets; perform a second scan by scanning the multiple beamlets over a second sample region; acquire multiple cell images of the second sample region, wherein at least a part of an overlapped region between the first sample region and the second sample region is scanned by at least a beamlet of the multiple beamlets during both the first scan and the second scan; and determine a relative position between at least two beamlets of the multiple beamlets based on the corresponding cell images acquired during the first scan and the second scan. In a first example of the system, the system further includes wherein the controller is further configured to: directing the multiple beamlets from the first sample region to the second sample region by actuating the deflectors between the first scan and the second scan. A second example of the system optionally includes the first example and further includes wherein the controller is further configured to: perform a third scan by scanning the multiple beamlets over a third sample region; acquire multiple cell images of the third sample region; generating a sample image by stitching the multiple cell images of the third sample region based on the relative position between the at least two beamlets of the multiple beamlets.

What is claimed is:

1. A method for determining beamlets' positions in a multi-beam system, comprising:
    performing a first scan by scanning multiple beamlets over a first sample region;
    acquiring multiple cell images of the first sample region, wherein each cell image is formed based on signals received responsive to irradiation from a corresponding beamlet of the multiple beamlets;
    performing a second scan by scanning the multiple beamlets over a second sample region;
    acquiring multiple cell images of the second sample region, wherein at least a part of an overlapped region between the first sample region and the second sample region is scanned by the same beamlet of the multiple beamlets during both the first scan and the second scan; and
    determining a relative position between at least two beamlets of the multiple beamlets based on the cell images acquired using the same beamlet during the first scan and the second scan.

2. The method of claim 1, wherein a first cell image corresponding to a particular beamlet of the multiple beamlets is acquired during the first scan, a second cell image corresponding to the beamlet is acquired during the second scan, and the first cell image overlaps with the second cell image.

3. The method of claim 1, wherein determining the relative position between the at least two beamlets of the multiple beamlets based on the cell images acquired using the same beamlet during the first scan and the second scan includes determining a displacement of the beamlet from an expected beamlet position based on a shift of at least a feature of the overlapped region in the cell images.

4. The method of claim 3, further includes: responsive to no identifiable feature in the overlapped region in either the first cell image or the second cell image, determining the relative position between the at least two beamlets based on positions of one or more other beamlets.

5. The method of claim 4, wherein determining the relative position between the at least two beamlets based on positions of one or more other beamlets includes determining the relative position between the at least two beamlets by fitting a polynomial model to the positions of one or more other beamlet.

6. The method of claim 1, wherein scanning multiple beamlets over the first sample region includes scanning each beamlet over a different portion of the first sample region, and wherein a scan range of each beamlet is not less than an expected distance between adjacent beamlets at a sample plane.

7. The method of claim 1, further comprising: translating the sample by actuating a sample stage; acquiring multiple cell images of a third sample region; and generating a sample image of the third sample region from the multiple cell images of the third sample region based on the determined relative positions between the at least two beamlets of the multiple beamlets.

8. The method of claim 7, wherein the second sample region does not overlap with the third sample region.

9. The method of claim 1, wherein determining the relative position between the at least two beamlets of the multiple beamlets based on the cell images acquired using the same beamlet during the first scan and the second scan includes: determining a position of each and every beamlet of the multiple beamlets at a sample plane based on the cell images acquired during the first scan and the second scan.

10. The method of claim 9, wherein the first sample region and the second sample region belong to a reference sample, and the method further comprising: saving the position of each beamlet; scanning the multiple beamlets over a second sample; generating a sample image of the second sample based on the saved position of each beamlet.

11. The method of claim 10, wherein generating the sample image of the second sample based on the saved position of each beamlet includes: acquiring multiple cell images of the second sample, and generating the sample image of the second sample by stitching the acquired multiple cell images of the second sample based on the saved position of each beamlet.

12. The method of claim 1, further comprising translating the sample by actuating a sample stage between the first scan and the second scan.

13. The method of claim 1, further comprising directing the multiple beamlets to the second sample region by adjusting one or more deflectors between the first scan and the second scan.

14. A multi-beam system, comprising:
    a beam source for generating multiple beamlets;
    deflectors for scanning the multiple beamlets over a sample relative to a beam axis;
    a sample holder for translating the sample; and
    a controller including computer readable instructions stored in a non-transitory memory, wherein when the computer readable instructions are executed by a processor, the controller is configured to:
    perform a first scan by scanning multiple beamlets over a first sample region;
    acquire multiple cell images of the first sample region, wherein each cell image is formed based on signals received responsive to irradiation from a corresponding beamlet of the multiple beamlets;
    perform a second scan by scanning the multiple beamlets over a second sample region;
    acquire multiple cell images of the second sample region, wherein at least a part of an overlapped region between the first sample region and the second sample region is scanned by the same beamlet of the multiple beamlets during both the first scan and the second scan; and determine a relative position between at least two beamlets of the multiple beamlets based on the cell images acquired using the same beamlet during the first scan and the second scan.

15. The multi-beam system of claim 14, wherein the controller is further configured to: directing the multiple beamlets from the first sample region to the second sample region by actuating the deflectors between the first scan and the second scan.

16. The multi-beam system of claim 14, wherein the controller is further configured to: direct the multiple beamlets to the first sample region and perform the first scan; and after acquiring the multiple cell images of the first sample region, direct the multiple beamlets to the second sample region by adjusting the deflectors and perform the second scan.

17. The multi-beam system of claim 16, wherein the controller is further configured to: translate the sample via the sample holder; perform a third scan by scanning the multiple beamlets over a third sample region; acquire multiple cell images of the third sample region; generating a sample image by stitching the multiple cell images of the third sample region based on the relative position between the at least two beamlets of the multiple beamlets.

18. The multi-beam system of claim 17, wherein the second sample region does not overlap with the third sample region.

* * * * *